United States Patent [19]
Allen et al.

[11] Patent Number: 5,206,184
[45] Date of Patent: Apr. 27, 1993

[54] METHOD OF MAKING SINGLE LAYER PERSONALIZATION

[75] Inventors: Joanne M. Allen, Scotts Valley; Richard B. Hansen, Bonny Doon; Guntram K. Wolski, Watsonville; Keith R. Venes, Aptos, all of Calif.

[73] Assignee: Sequoia Semiconductor, Inc., Scotts Valley, Calif.

[21] Appl. No.: 792,586

[22] Filed: Nov. 15, 1991

[51] Int. Cl.$^5$ .............................................. H01L 21/60
[52] U.S. Cl. ...................................... 437/51; 437/206; 148/DIG. 20
[58] Field of Search .................. 437/8, 48, 51, 52, 180, 437/204, 205, 206; 148/DIG. 8, DIG. 20

[56] References Cited
U.S. PATENT DOCUMENTS

| | | | |
|---|---|---|---|
| 4,682,201 | 7/1987 | Lipp | 437/186 |
| 4,745,084 | 5/1988 | Rowson et al. | 437/51 |
| 5,084,404 | 1/1992 | Sharpe-Geisler | 437/51 |

Primary Examiner—Brian E. Hearn
Assistant Examiner—C. Chaudhari
Attorney, Agent, or Firm—Blakely, Sokoloff, Taylor & Zafman

[57] ABSTRACT

A process for implementing logic units using base cells and implementing an electrical connection between the logic units in a gate array. The process includes determining a connection path between the base cells and connecting the base cells at the second metalization layer using a portion of the first metalization layer. This is possible due to the gate array having vertical first metalization layer segments of the first metalization layer positioned vertically in the channel between the rows of base cells, wherein each of the vertical segments has vias in the insulation layer between the first metalization layer and the second metalization layer at its endpoints for connecting the metalization layers. Similarly, the individual transistors which comprise the base cell are coupled using the second metalization layer to implement a specific logic unit.

11 Claims, 5 Drawing Sheets

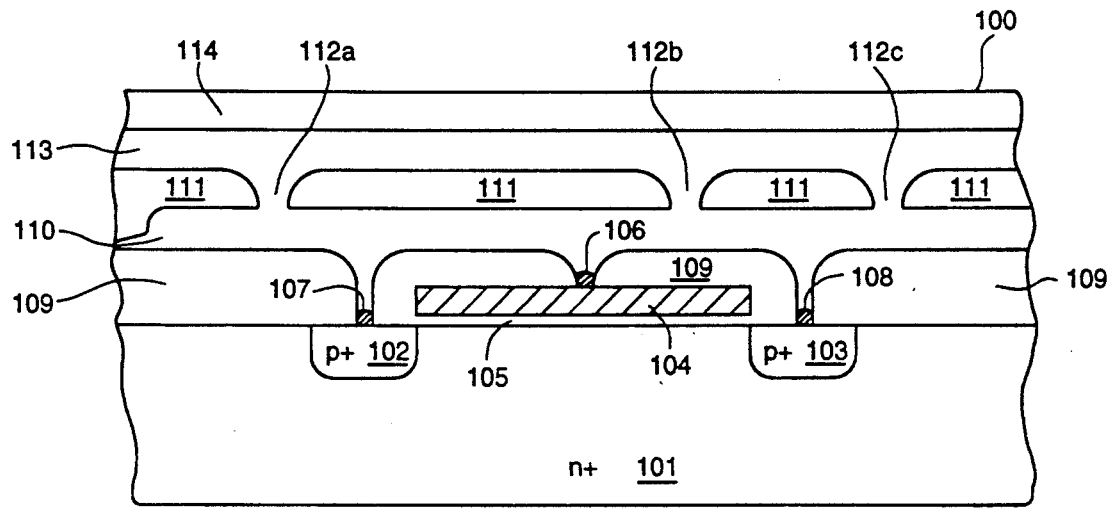
FIG_1 (PRIOR ART)
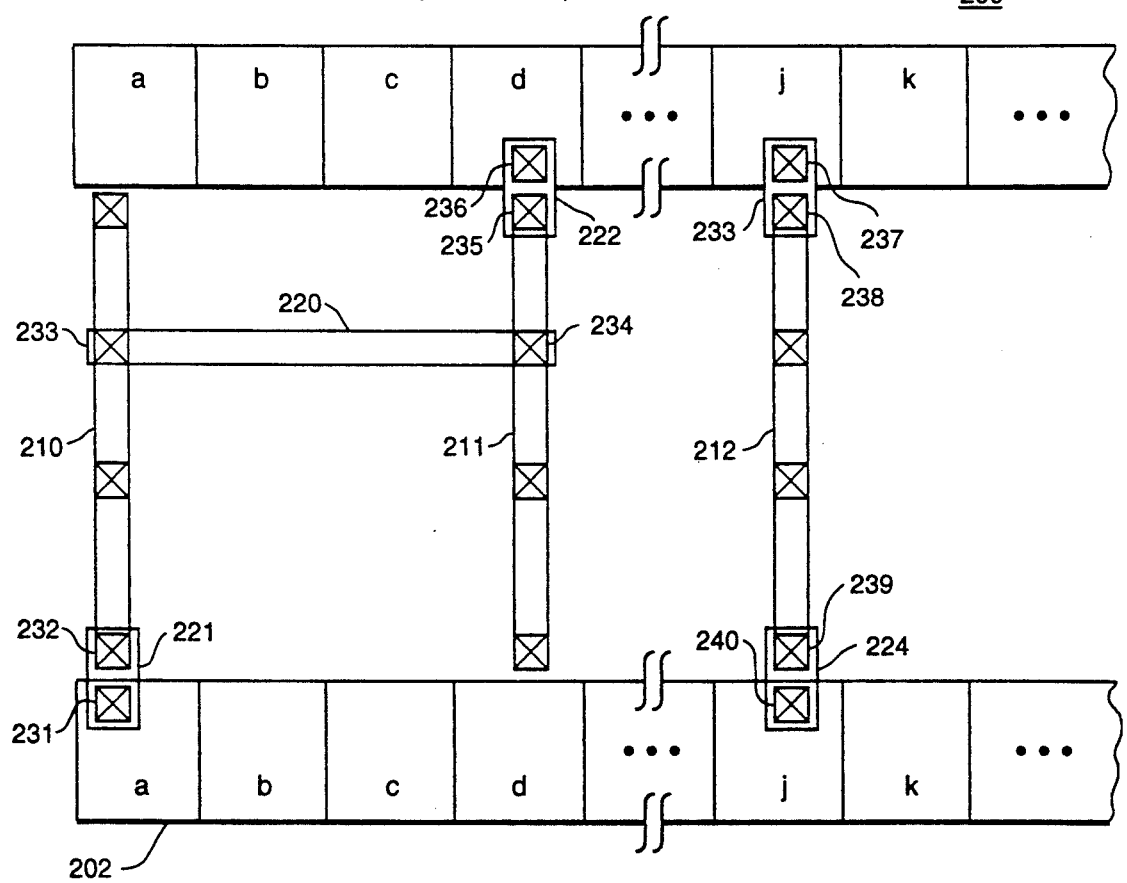
FIG_2 (PRIOR ART)
LEGEND
⊠ CONTACT OVER POLYSILICON

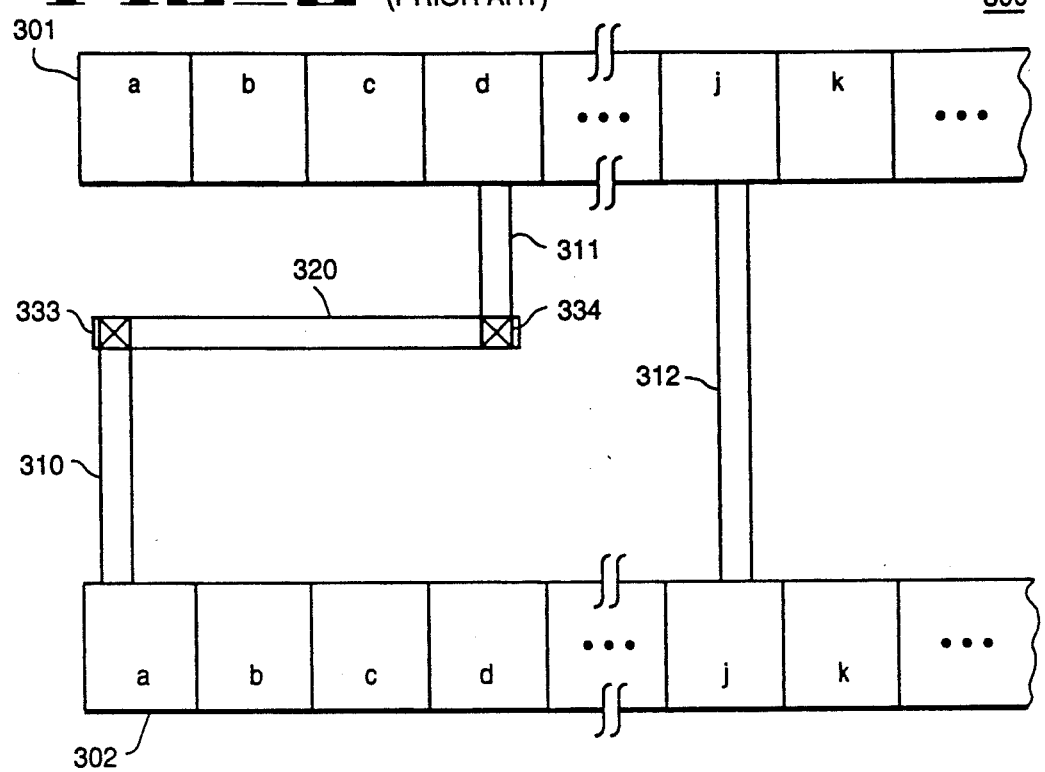
FIG_3 (PRIOR ART)
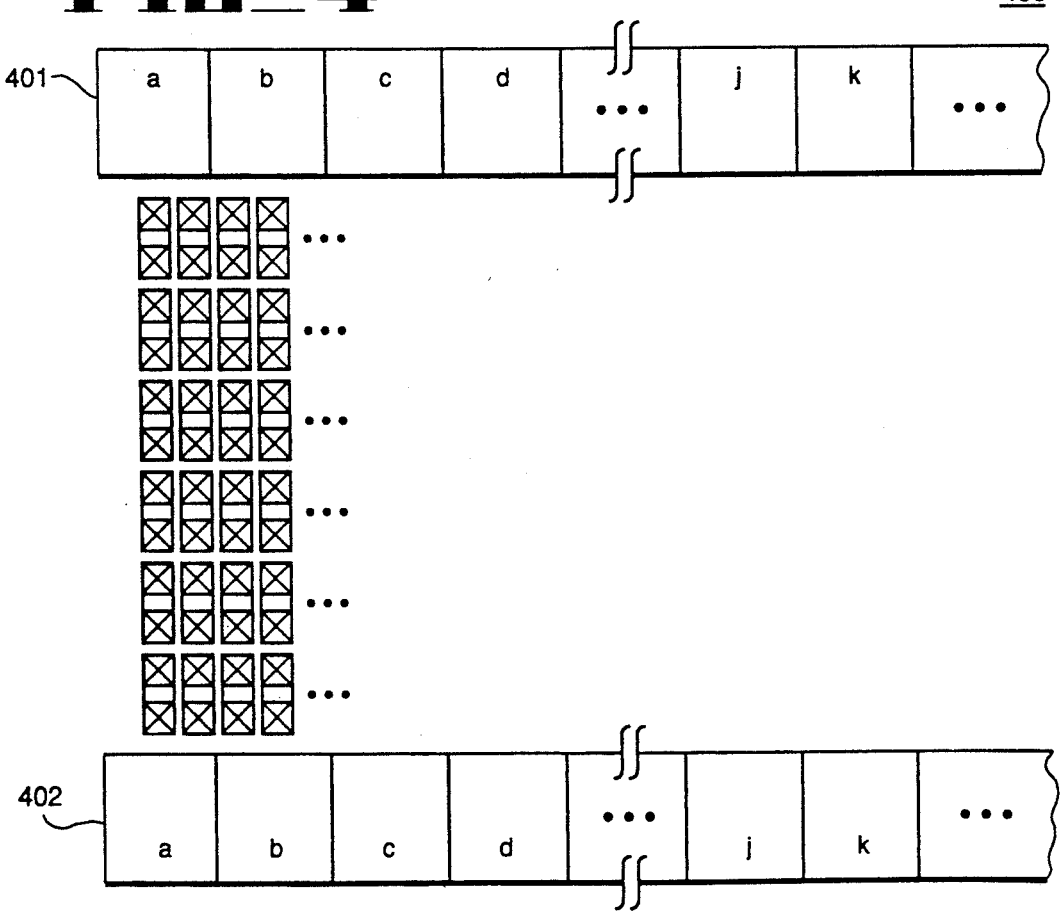
FIG_4

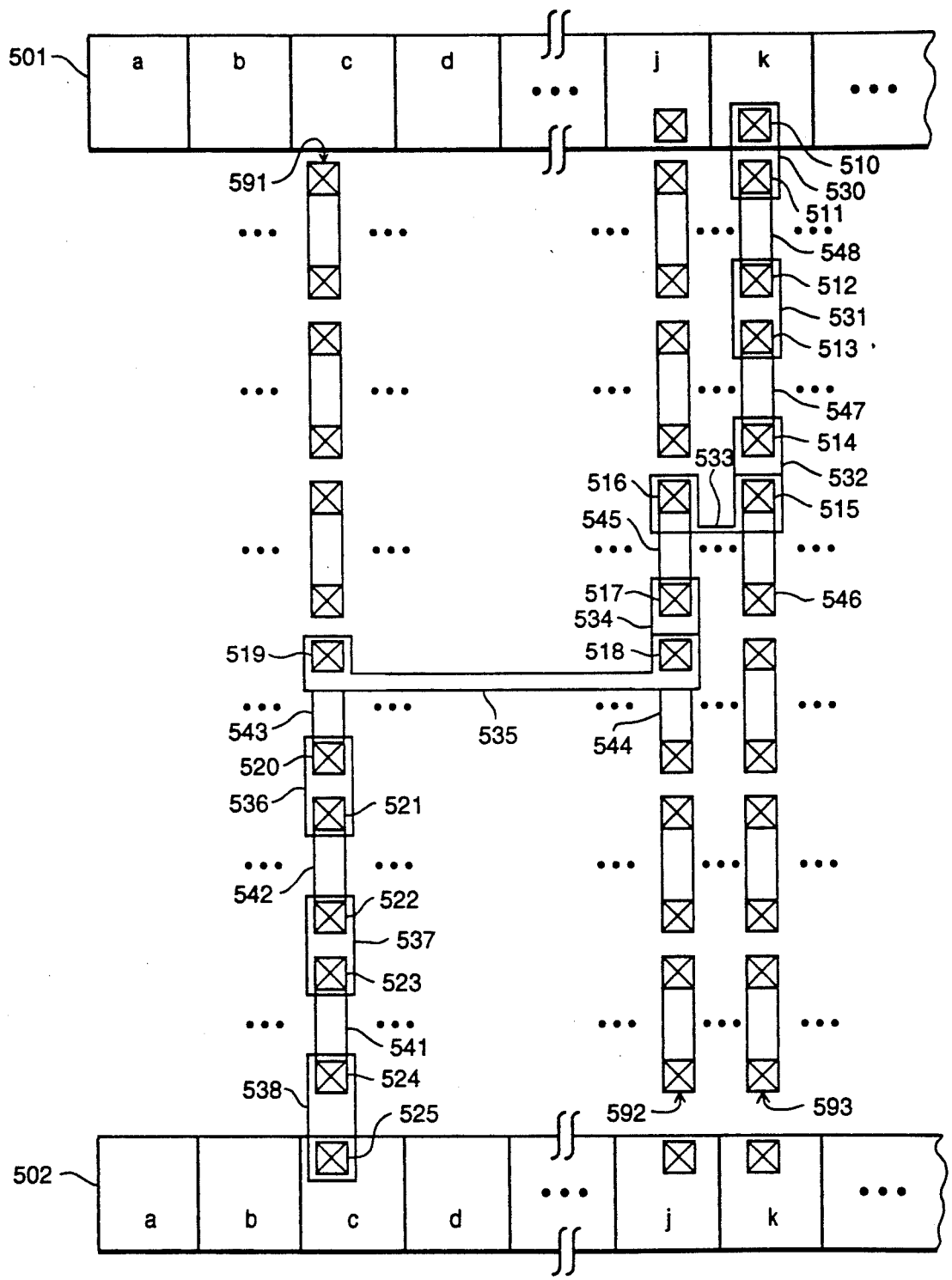
FIG_5

FIG_6
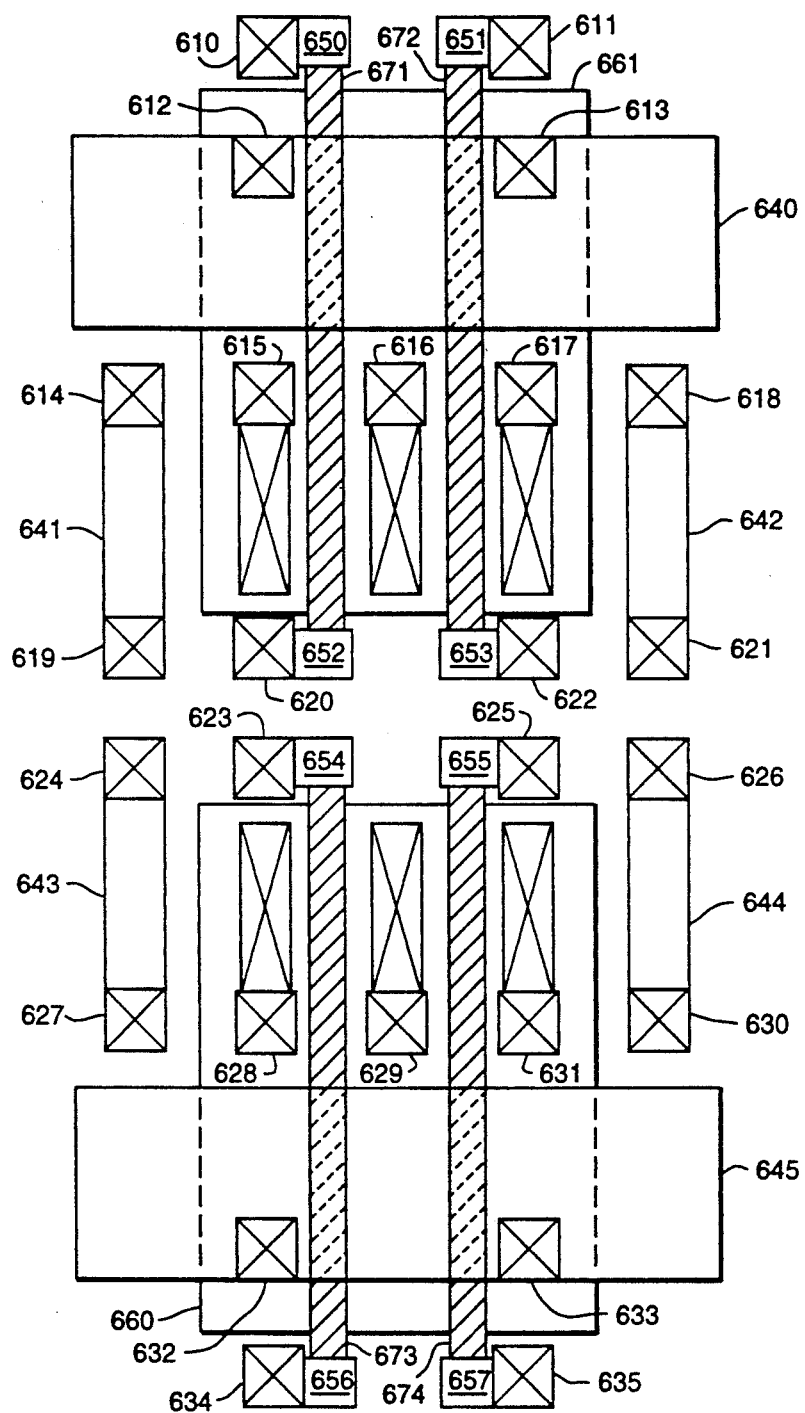

FIG_7
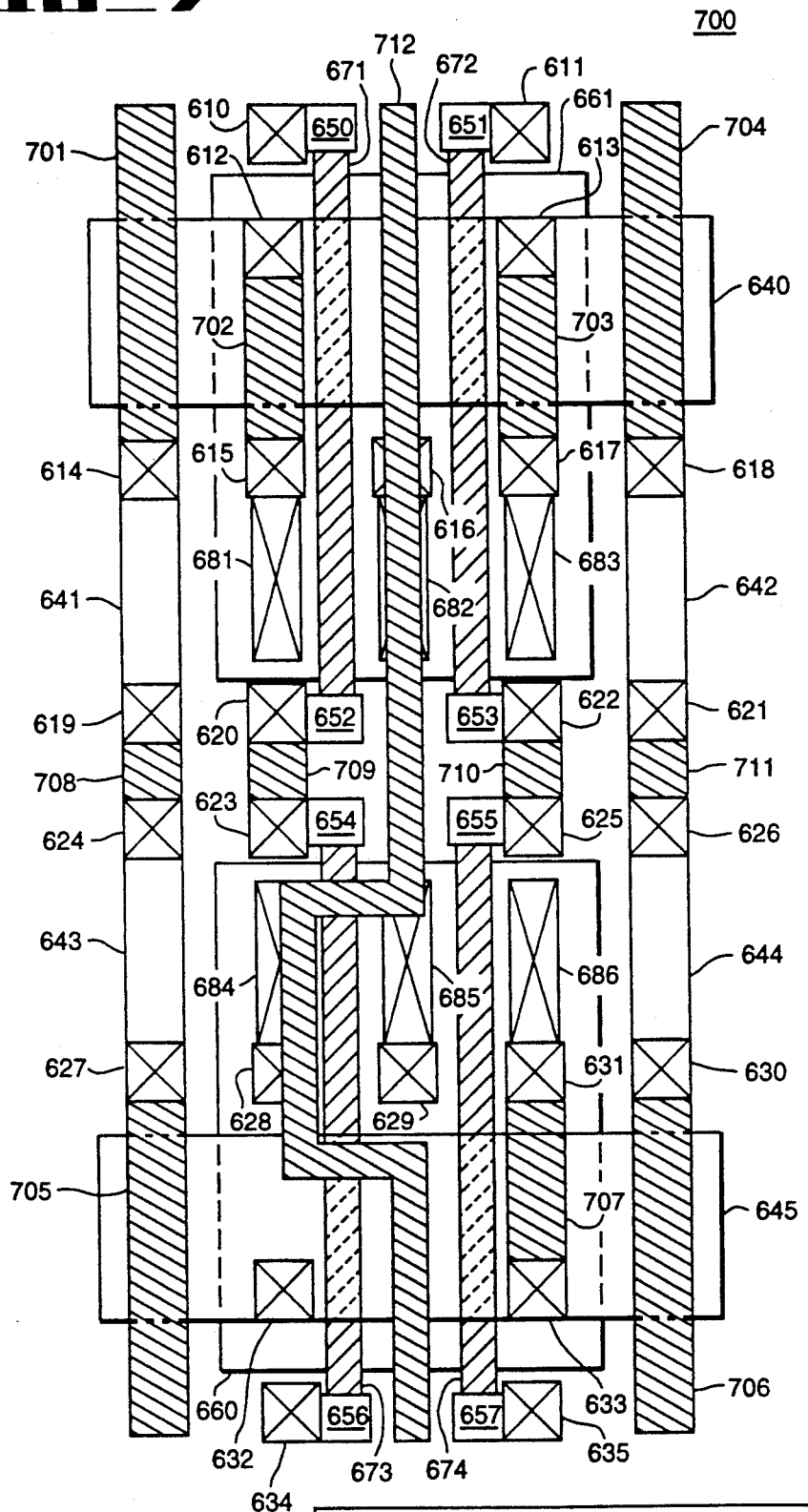

METHOD OF MAKING SINGLE LAYER PERSONALIZATION

FIELD OF THE INVENTION

The present invention relates to the field of integrated circuits; more particularly, the present invention relates to the processes and methods for implementing these devices.

BACKGROUND OF THE INVENTION

Typically integrated circuits (ICs) are manufactured through the manipulation of photographic masks. Today, custom logic can be built on an IC that contains an array of transistors with programmable interconnections. These are referred to as gate arrays. The logic of the transistors and the interconnect are configurable based on the user's needs. The architecture of these gate arrays consists of rows (columns) of transistors separated by a distance that is used to connect the rows (columns) together. The space between the rows is also used to bring connections to the I/O logic which is usually around the periphery of the IC.

A fully customizable IC consists of many layers. A typical gate array has some number of base layers required to build the transistors, with the top four layers of the IC being programmable. The four programmable layers are used to define the logic function of the array of transistors as well as provide the interconnect between the defined logic functions.

FIG. 1 shows a device, usually a transistor, fabricated as p-channel metal-oxide semiconductor (PMOS) transistor 100. The fabrication of PMOS transistor 100 involves a series of steps. Referring to FIG. 1, PMOS transistor 100 consists of substrate 101 which is doped with n+. The n+ doping indicates a heavily doped substrate. Diffused into substrate 101 are two p+ regions 102 and 103. These are typically implanted using ion-beam technology. Once again, the p+ designation indicates a strong doping of p carriers. An oxide layer 105 is created on top of the n+ region 101 between p+ regions 102 and 103. A polysilicon (Si) layer 104 is built on the oxide layer 105. An insulation layer 109 is grown over substrate 101. The polysilicon layer 104 and p+ regions 102 and 103 represent the three parts of a transistor device.

To create the transistor device, PMOS transistor 100, p+ regions 102 and 103 and polysilicon 104 are connected. The connection to the device occurs using contacts (i.e., holes) 106, 107, and 108. These contacts are connected to a first metalization layer 110. First metalization layer 110 could be aluminum. An insulation layer, oxide 111, is fabricated over metalization layer 110. Holes, known as vias, are created in insulation layer 111. The vias are formed using well-known mask technology, wherein a photographic process, in conjunction with an etchant, creates a hole. Next, a second metalization layer 113, is placed over insulation layer 111. In fabricating metalization layer 113, metal flows into the vias and connects to metalization layer 110. Vias are shown as 112a, 112b and 112c in FIG. 1. Finally, an insulation layer, oxide 114, covers the entire wafer, including PMOS transistor 100, to complete the fabrication process. NMOS transistors are built similarly but with opposite dopings.

As described above with respect to FIG. 1, logic units are formed by coupling multiple transistors together. Each logic unit can perform a different logic function. Thus, custom logic can be built by connecting individual logic functions together. In gate arrays, rows of same sized transistors are created and equally spaced apart. To customize the logic, sets of transistors are then connected together to form a logic unit and the logic units are connected through the spacing, i.e. channel, between the rows of transistors (which are now formed into logic units). Usually, a minimum set of transistors, possibly two PMOS and two NMOS, is required to create a logic function. This minimum set is known as a base cell. A logic unit may consist of one or more base cells.

To create the logic units, known as personalizing the transistors or base cells, and the connections, a place and route software chooses the location of the logic units and how they are to be connected. To electrically create and connect the logic units, the wafer is processed using the four steps referenced above (contact, first metalization, via, second metalization). This entire process is known as "personalizing the gate array." To complete these steps, four separate masking steps are required, one for each processing step. The personalization and connection of the units is performed using both metalizations and their corresponding interconnections. A common routing technique would utilize the first metalization for portions of the path which run vertically between the rows, i.e. in the channel space, and use the second metalization for the portions of the path that run horizontally through the channel space. The first and second metalizations are coupled with vias. This allows a path to avoid collisions with other paths since all horizontal runs are insulated from vertical runs.

The problem with the prior art is that four stages of fabrication are required to create custom logic. Each stage requires four separate masks and a considerable amount of time. Furthermore, if a problem occurs in the fabrication of any of the stages, the entire process must be repeated.

The present invention avoids these problems of customizing integrated circuits by utilizing gate arrays which are fabricated up to the last metal layer (i.e., the second metalization layer) and personalizing and connecting base cells to form logic units in the array at the second metalization layer using portions of the first metalization layer. This allows for a faster turn-around time for creating the custom chip and better reliability.

SUMMARY OF THE INVENTION

A process for fabricating logic units and an electrical connection between logic units of a gate array is described. A gate array having segments of a first metalization layer fabricated in the gate array vertically in the connection channel perpendicular to the rows of base cells, which consist of transistors, is used in conjunction with the process. Over the ends of each segment are vias which can be used for connection to a second layer of metalization. The first step in the process is determining an electrical connection path between two logic units. The connection path is composed of segments which are horizontal and vertical with respect to the space between the rows of base cells in the array. After the electrical connection path has been designed, a second metalization layer connects the vertical segments together using the vias positioned at the ends of the vertical segments. The logic units are also connected to the vertical segments through the vias. The horizontal portions of the electrical connection path consist of the second metalization layer connected to coupled vertical segments using the via of the segments which represents the endpoint of the coupled vertical segments. In the currently preferred embodiment, the logic units of the different rows are connected with the second metalization layer using a portion of the first metalization layer.

Moreover, the present invention discloses a process for implementing a specific logic function using the transistors of the base cells. The process involves designing a logic function for the particular base cell and coupling the transistors in the base cell to form the logic unit at the second metalization layer.

BRIEF DESCRIPTION OF THE DRAWINGS

The present invention will be understood more fully from the detailed description given below and from the accompanying drawings of the preferred embodiments of the invention, which, however, should not be taken to limit the invention to the specific embodiments, but are for explanation and understanding only.

FIG. 1 illustrates the cross-sectional view of an integrated (IC) circuit.

FIG. 2 illustrates one method of connecting electrical base cells of a gate array in the prior art.

FIG. 3 illustrates a second method of connecting base cells of a gate array in the prior art.

FIG. 4 illustrates the gate array utilized by the currently preferred embodiment of the present invention.

FIG. 5 illustrates an example of the fabrication of an integrated circuit using the process of the currently preferred embodiment.

FIG. 6 illustrates the base cell utilized by the currently preferred embodiment of the present invention.

FIG. 7 illustrates an example of the electrical connection of the base cell using the process of the currently preferred embodiment.

DETAILED DESCRIPTION OF THE INVENTION

A fabrication process for connecting base cells in a gate array is described. In the following description, numerous specific details are set forth such as specific numbers of base cells and segments, etc., in order to provide a thorough understanding of the present invention. It will be obvious, however, to one skilled in the art that the present invention may be practiced without these specific details. In other instances, well-known processing steps have not been described in detail to avoid unnecessarily obscuring the present invention.

FIG. 2 shows a top-level view of a portion of a gate array that can be fabricated in one manner in the prior art to perform custom logic functions. Referring to FIG. 2, partial gate array 200 includes a first row of base cells, 201, in parallel with a second row of base cells, 202. Each base cell in the rows is a group of transistors which, when coupled together in a particular configuration, perform a specific logic function. The coupling of base cells to create specific logic functions is commonly referred to as "customization" or "personalization." To customize gate array 200, polysilicon layers are fabricated using well-known mask technology. The polysilicon layers routing paths travel vertically in the channel space, such that the paths of the polysilicon layers are perpendicular to rows of base cells 201 and 202. Columns 210-212 are examples. Typically, multiple columns exist within the channel space. Horizontal path routing is accomplished using a metalization layer. The first metalization layer connects the vertical polysilicon path routes using the contacts.

When routing an electrical connection vertically through the channel space, multiple vertical columns can be employed, such as columns 210, 211 and 212. Each column has contacts spaced throughout for connection to the horizontal paths of the first metalization layer. To utilize one of the columns in the gate array, a base cell through a contact is coupled to a portion of the first metalization layer. The other end of the first metalization layer is coupled to a vertical column through another via.

Two examples of routing electrical connection paths between base cells is shown in FIG. 2. An electrical connection is made between base cell 201d and base cell 202a. The base cell 201d-202a path comprises jumpers 220-222 of the first metalization layer. Base cell path 201d-202a also includes vertical columns 210 and 211 of the polysilicon layer. To create the path, a point in base cell 201d is connected with jumper 222 of the first metalization layer through contact 236. Jumper 222 is also connected to column 211 of the polysilicon layer through via 235. Thus, base cell 201d is connected to column 211 of the polysilicon layer. Column 211 is connected to jumper 220 of the first metalization layer through contact 234. Jumper 220 is connected to polysilicon column 210 through contact 233. Polysilicon column 210 is connected to jumper 211 through contact 232. Jumper 211 is connected to base cell 202a through contact 231. Thus, a point in base cell 201d is connected to a point in base cell 202a.

In actuality, polysilicon columns 210 and 211 are fabricated first. An insulation layer covers these polysilicon layers. Contacts 231-236 are then created using an etching process. Then, jumpers 220-222 are fabricated over the insulation layer and are connected to the polysilicon columns through contacts 231-236. In this manner, the electrical connections are made between base cells of gate array 200.

With respect to the electrical path between base cells 201d and 202a, columns 210 and 211 cannot be used for further electrical connections. This is because columns 210 and 211 are single conductors and already have an electrical connection. Therefore, any unused portion of columns 210 and 211, or any columns similarly situated in the array, cannot be utilized in another electrical connection between base cells of rows 201 and 202. It is true that horizontal jumpers of the first metalization layer can cross the column lines, including columns 210 and 211, without interfering because of the insulation layer between the polysilicon and the first metalization layer.

Another electrical connection path is shown running from base cell 201j to base cell 202j. In the base cell path 201j-202j, base cell 201j is connected to jumper 233 of the first metalization layer through contact 237. The other end of jumper 233 is connected to polysilicon column 212. Column 212 is also connected to jumper 224 of the first metalization layer through contact 239. The other end of jumper 224 is coupled to base cell 201j through contact 240.

FIG. 3 shows a top-level view of a portion of a gate array fabricated according to a second method in the prior art. Referring to FIG. 3, partial gate array 300 includes a first row of base cells, 301, in parallel to a second row of base cells 302. Partial gate array 300 is customized to create specific logic functions. To customize gate array 300, a first metalization layer is fabricated using well-known mask technology. The first metalization layer routing paths travel vertically in the channel space, such that the paths of the first metalization are perpendicular to the rows of base cells 301 and 302. Columns 310–312 are examples. Horizontal routing is accomplished using a second metalization layer. The second metalization layer connects the vertical path routes using the vias. This fabrication method clearly requires all four fabrication steps (i.e., contact, first metalization, via, and the second metalization).

When routing an electrical connection vertically through the channel space, multiple vertical columns can be employed, such as columns 310, 311 and 312. Each column, such as columns 310–312, has vias over the endpoints for connection to the horizontal paths of the second metalization layer. To utilize one of the columns in the gate array, a base cell through a via is coupled to a portion of the second metalization layer. The other end of the second metalization layer is coupled to a vertical column through another via.

Two examples of routing electrical connection paths between base cells is shown in FIG. 3. An electrical connection is made between base cell 301d and base cell 302a. The base cell 301d–302a path comprises jumper 320 of the second metalization layer and vertical columns 310 and 311 of the first metalization layer. To create the path, base cell 301d is connected to column 311 of the first metalization layer without a jumper of the second metalization layer. Column 311 is connected to jumper 320 of the first metalization layer through via 334. Jumper 320 is also connected to column 310 of the first metalization layer through via 333. Column 310 is connected to base cell 302a without a jumper of the second metalization layer. Thus, a point in base cell 301d is connected to a point in base cell 302a.

With respect to electrical path between base cells 301d and 302a, both columns 310 and 311 are only fabricated into the channel space to the extent necessary to create the electrical path. Therefore, any unused portion of particular column can still be used in a separate electrical path between other base cells.

Another electrical connection path is shown running from base cell 301j to base cell 302j. In the base cell 301j–302j, base cell 301j is connected to column 312 of the first metalization layer without use of the second metalization layer. Column 312 is also connected to base cell 202j without the use of the second initialization layer. It should be noted that the electrical connection path is one solid conductor between the base cells.

FIG. 4 shows the top view of the gate array utilized by the currently preferred embodiment, gate array 400. A portion of the gate array 400 shows two rows of base cells, 401 and 402. Each base cell comprises four transistors, 2 NMOS and 2 PMOS, which are enough to form the basis for any logic function. Electrically connecting and grouping together of base cells creates logic capable of performing more complex functions. Referring to FIG. 4, the space between base cell rows 401 and 402, the channel space, is fabricated with small vertical segments of the first metalization layer. In the currently preferred embodiment of the present invention, each column across the channel space has six closely separated vertical segments. Each segment has a via over both end portions. The actual number of segments is a design choice. The actual number of columns is also design choice. In the currently preferred embodiment, the columns are evenly spaced, with there being five columns per base cell. Furthermore, each base cell in rows 401 and 402 have at least one via to allow it to be electrically connected to cells across the channel space. Thus, gate array 400 as utilized by the currently preferred embodiment of the present invention is a gate array which is fabricated up to the via level. Therefore, only fabrication of the second metalization layer is required to "customize" the chip (i.e., implement logic functions and electrically connect base cells of different rows).

To couple any of the base cells in row 401 to a base cell in row 402, the second metalization layer is used to connect the requisite vertical segments together using the vias at the end of each of the segments. Furthermore, a base cell is connected to a vertical segment using its via and the via of the vertical segment. In connecting segments of the first metalization layer to other segments of different columns, the second metalization layer is fabricated on the gate array horizontally connecting the vias of the connected vertical columns.

In the currently preferred embodiment, three horizontal paths of the second metalization layer may run across each vertical segment. These horizontal runs are referred to as "tracks." Thus, for each vertical segment three tracks of the second metalization layer may cross horizontally through the segment. Therefore, because in the currently preferred embodiment, there are six vertical segments per column, a total of eighteen tracks run horizontally through the channel space. Therefore, at any one time, eighteen signals can be travelling horizontally through the channel space. Of the three tracks, the middle track running through the center is for longer signal runs. The outside tracks allow for ease in connecting the jumpers of the second metalization layer to the vias at the endpoints of the vertical segments.

An sum, the customizing of gate array 400 takes place at the second metalization layer using a portion of the first metalization layer as already fabricated within the channel. Thus, a chip can be customized on the last layer which requires only one mask and reduces the time it takes to fabricate a custom chip.

An example of routing an electrical connection path between base cells using the present invention is shown in FIG. 5. An electrical connection is made between base cell 501k and base cell 502c. The base cell 501k–502c path comprises jumpers 530–538 of the second metalization layer. Base cell path 501k–502c also includes vertical columns 591, 592 and 593 of the first metalization layer. Column 591 includes among its vertical segments, segments 541–543. Column 592 includes vertical segments 544 and 545. Column 593 includes vertical segments 546 through 548. To create the path, base cell 501k is connected to jumper 530 through via 510. Jumper 530 is also coupled to vertical segment 548 through via 511. Vertical segment 548 is coupled to jumper 531 through via 512. Jumper 531 of the second metalization layer is also coupled to vertical segment 547 of the first metalization layer through via 513. Vertical segment 547 is connected to jumper 532 of the second metalization layer through via 514. Jumper 532 is coupled to vertical segment 546 of the first metalization layer through via 515. Vertical segment 546 is also coupled to jumper 533 of the second metalization layer through via 515. Jumper 533 is coupled to vertical segment 545 of the first metalization layer through via 516. Vertical segment 545 is coupled to jumper 534 of the second metalization layer through via 517. Jumper 534 is coupled to vertical segment 544 of the first metalization layer through via 518. Vertical segment 544 is also coupled to jumper 535 through via 518. Jumper 535 of the second metalization layer is coupled to vertical segment 543 of the first metalization layer through via 519. Vertical segment 543 is coupled to jumper 536 of the second metalization layer through via 520. Jumper 536 is coupled to vertical segment 542 through via 521. Vertical segment 542 is coupled to jumper 537 of the second metalization layer through via 522. Jumper 537 is coupled to vertical segment 541 of the first metalization layer through via 523. Vertical segment 541 is coupled to jumper 538 of the second metalization layer through via 524. Finally, jumper 538 is coupled to base cell 502c through via 525. Thus, base cell 501k is connected to base cell 502c.

In actuality, vertical segments 541–548 of the first metalization layer within the channel space are fabricated first. An insulation layer covers this first metalization layer. Vias 510–525 are then created using an etching process. Then, jumpers 530–538 and any other associated jumpers for electrical connection paths within the channel space are fabricated over the insulation layer and are connected to the vertical segments through vias 510–525. In this manner, an electrical connection has been fabricated between base cell 501k and 502c using the second metalization layer with a portion of the first metalization layer.

One benefit of the present invention is that customizing of the chip can be accomplished at the second layer of metalization. The second layer of metalization only requires a single masking step. The prior art customization required four masking steps to produce an implementation of the array to create a specific logic function. The reduction of three masking steps reduces the turn-around time in producing the IC. Furthermore, because the columns within the channel space of the gate array are segmented, a connection to any one of the segments does not render the remainder of the column unusable. Therefore, any other electrical connections using portions of the column can be done. Moreover, the present invention improves reliability of using a customized chip. The improved reliability is derived from the fact that only one masking step remains before producing the customized chip. In this way, any fabrication problems or difficulties associated with the other three masking steps are eliminated. Therefore, turn-around time is substantially improved with a more reliable custom chip.

The base cell of the gate array utilized by the currently preferred embodiment is shown as base cell 600 in FIG. 6. Base cell 600 is fabricated up to the via level, such that only the top layer remains to be fabricated to customize base cell 600 for a specific logic function. Base cell 600 is comprised of vias 610–635, contacts 650–657 and 681–686, first metalization layer segments 640–645, PMOS transistors 671 and 672, NMOS transistors 673 and 674, p-diffusion area 661 and n-diffusion area 660. Referring to FIG. 6, via 610 is positioned to allow for coupling to PMOS transistor 671 through the first metalization layer (not shown) and contact 650. Via 620 is positioned to allow for coupling to the other end of PMOS transistor 671 through the first metalization layer (not shown) and contact 652. Via 611 is positioned to allow for coupling to PMOS transistor 672 through the first metalization layer (not shown) and contact 651. Via 622 is positioned to allow for coupling to the other end of PMOS transistor 672 through the first metalization layer (not shown) and contact 653. Via 612 is positioned for coupling to first metalization segment 640.

Via 613 is also positioned for coupling to segment 640. Via 615 is coupled to contact 681 through the first metalization layer (not shown). Contact 681 is coupled to p-diffusion area 661. Via 616 is coupled to contact 682 through the first metalization layer (not shown). Contact 682 is coupled to the p-diffusion area 661. Via 617 is coupled to contact 683 through the first metalization layer (not shown). Contact 682 is coupled to p-diffusion area 661. Via 614 is positioned for coupling to first metalization layer segment 641. Via 619 is positioned for coupling to segment 641. Vias 618 and 621 are positioned for coupling to first metalization layer 642. Vias 624 and 627 are positioned for coupling to first metalization layer 643. Vias 626 and 630 are positioned for the coupling of first metalization layer segment 644. Via 623 is positioned to allow for coupling to NMOS transistor 673 through the first metalization layer (not shown) and contact 654. Via 634 is positioned to allow for coupling to the other end of NMOS transistor 673 through the first metalization layer (not shown) and contact 656. Via 625 is positioned to allow for coupling to NMOS transistor 674 through the first metalization layer (not shown) and contact 655. Via 635 is positioned to allow for coupling to the other end of NMOS transistor 674 through the first metalization layer (not shown) and contact 657. Vias 632 and 633 are positioned to allow coupling to the first metalization layer segment 645. Vias 628, 629, and 631 are positioned for coupling to n-diffusion layer 660 through the first metalization layer and contact holes 684, 685, and 686.

An example of routing an electrical connection path between the transistors in base cell 600 to form a specific logic function, base cell 700, using the present invention is shown in FIG. 7. The specific logic function implemented in base cell 700 is a two-input NAND gate. The transistors have been personalized (i.e., connected) with twelve segments of the second metalization layer, segments 701–712.

Segments 701, 704, 705, 706, 708 and 711 are utilized to provide an electrical connection through base cell 700. Segment 701 is coupled to segment 641 of the first metalization layer through via 614. Segment 708 is coupled to the other end of segment 641 using via 619. The other end of segment 708 is coupled to segment 643 of the first metalization layer using via 624. Segment 705 is coupled to the other end of segment 643 through via 627. Segment 704 is coupled to segment 642 of the first metalization layer through via 618. Segment 711 is coupled to the other end of segment 642 using via 621. The other end of segment 711 is coupled to segment 644 of the first metalization layer. Segment 705 is coupled to the other end of segment 644 through via 630.

Segments 702 and 703 couple p-diffusion layer 661 at contacts 681 and 683 respectively to segment 640 of the first metalization layer. Segment 640 is coupled to the power source, Vdd, in the currently preferred embodiment. Therefore, the points in p-diffusion layer 661 at contacts 681 and 683 are connected to Vdd.

Segment 709 coupled PMOS transistor 671 to NMOS transistor 673 through vias 620 and 623 at respective contacts 652 and 654. segment 709 acts as one of the inputs to the NAND gate. Segment 710 couples PMOS transistor 672 to NMOS transistor 674 through vias 622 and 625 at contacts 653 and 655 respectively. Segment 710 acts as the other input to the NAND gate.

Segment 707 coupled vertical segment 645 through via 633 to n-diffusion layer 660 at contacts 686 through via 631. In the currently preferred embodiment, segment 645 of the first metalization layer is coupled to ground. Therefore, the points in n-diffusion layer 660 at contact 686 is coupled to ground. Segment 712 coupled the n-diffusion layer at contact 684 through via 628 to p-diffusion layer at contact 682 through via 616. Segment 712 acts as the output of the NAND gate.

Functionally, segments 702 and 703 function to coupled the drains of PMOS transistors 671 and 672 to power, Vdd. Segment 712 functions to couple the common drains of PMOS transistors 671 and 672 and the drain of NMOS transistor 673 to the output of the NAND gate. Segment 709 functions as the input to the gates of PMOS transistor 671 and NMOS transistor 673. Segment 710 functions as the input to the gates of PMOS transistor 672 and NMOS transistor 674. Segment 707 functions to couple the source of NMOS transistor 674 to ground. The common drains of NMOS transistors 673 and 674 effectively coupled NMOS transistorS 673 and 674 in series. Hence, the transistors of base cell 700 in FIG. 7 has been coupled to create a NAND gate using only the top, the second metalization, layer to customize the cell.

Other gate configurations and logic units can be created using the same process of the currently preferred embodiment. As with the NAND gate formed from base cell 700, each base cell in the gate array can be personalized at the top layer. By personalizing at the top layer, only one masking step is required. Thus, the turnaround time for producing a custom logic chip is greatly reduced.

Whereas many alterations and modifications of the present invention will no doubt become apparent to a person of ordinary skill in the art after having read the foregoing description, it is to be understood that the particular embodiment shown and described by way of illustration are in no way intended to be considered limiting. For instance, the number of vertical segments in each column running between the rows of base cells could be modified to any number according to user's design. Furthermore, a third metalization layer is currently being employed in the art. The present invention could be similarly utilized to customize an IC at the third layer. Therefore, a reference to the details of the preferred embodiments are not intended to limit the scope of the claims which themselves recite only those features regarded as essential to the invention.

A process for implementing a logic unit and an electrical connection path between multiple logic units in a gate array has been described.

We claim:

1. A process for fabricating an electrical connection between base cells of different rows in a gate array comprising the steps of:
   providing a gate array having rows of base cells, wherein a space is between said rows, wherein columns of segments of a first conductive layer are fabricated between the rows, said array having an insulative layer disposed on said segments, said insulative layer having vias over the base cells and each end of said segments
   determining a connection path for coupling said base cells of different rows in said gate array, such that said connection path comprises a plurality of said segments of said first conductive layer; and
   coupling said segments of said connection path using the vias of said path segments and a second conductive layer, such that said base cells of different rows are coupled at said second conductive layer utilizing a portion of said first conductive layer.

2. The process as defined in claim 1 wherein said columns of segments are aligned substantially vertical in said space, such that they are substantially perpendicular to said rows.

3. The process as defined in claim 1 wherein said path comprises sections, said sections being either horizontal or vertical to said rows.

4. In a gate array having parallel rows of base cells, A process for fabricating a connection between base cells of different rows in a gate array comprising the steps of:
   providing a gate array having rows of base cells, wherein each base cell comprises a plurality of transistors, wherein a space is between said rows, wherein columns of vertical segments of a first conductive layer are fabricated between the rows, such that said segments are substantially perpendicular to said rows, said array having an insulative layer disposed on said segments, said insulative layer having vias over the base cells and each end of said segments,
   designing a routing path between one of said base cells of different rows, wherein said routing path comprises portions which are vertical and horizontal to said rows; and
   coupling said base cells of different rows, wherein said vertical portions of said routing path comprise said vertical segments coupled together with a second conductive material using their respective vias, such that said base cells of different rows are coupled at said second conductive layer by using a portion of said first conductive layer.

5. The process defined in claim 4 wherein said vertical segments of different columns are coupled horizontally at said second conductive layer using their respective vias.

6. The process defined in claim 4 further comprising the step of coupling said transistors of each of said base cell to form a first functional logic unit using said vias and said second conductive layer, such that said electrical path and said base cells create a second logic unit when coupled.

7. A process for fabricating a connection between base cells of different rows in a gate array comprising the steps of:
   providing a gate array having parallel rows of base cells, wherein a space is between said rows, wherein columns of vertical segments of a first conductive layer are fabricated between the rows, such that said segments are substantially perpendicular to said rows, said array having an insulative layer disposed on said segments, said insulative layer having vias over the base cells and each end of said segments:
   coupling each of said base cells of different rows to one of said vertical segments using a second conductive layer, wherein said second conductive material is connected using said vias;
   creating an electrical path between said first and second points, said path consisting of horizontal parts and vertical parts, wherein said horizontal parts consist of said second conductive material and said vertical parts consisting of said vertical segments coupled together by said second conductive material using the respective vias of said vertical segments, the endpoints of said horizontal parts being coupled to the endpoints of said coupled vertical parts using their respective vias, such that said base cells of different rows are coupled at said second conductive layer by using a portion of said first conductive layer.

8. The process as defined in claim 7 further comprising the step of coupling said transistors of each of said base cells to form a first logic unit using said vias and said second conductive layer, such that said electrical path and said base cells create a second logic unit when coupled.

9. The process as defined in claim 7 wherein each of said vertical segments is associated with multiple tracks, wherein each track accommodates one of said horizontal parts.

10. A process for fabricating an electrical connection between base cells of different rows comprising the steps of:

providing a gate array having rows of base cells, wherein said base cells comprise a plurality of transistors, wherein said plurality can be coupled in multiple schemes to perform a simple logic function, wherein a space exists between said rows, wherein segments of a first conductive layer are fabricated between the rows, said array having an insulative layer disposed on said segments, said insulative layer having vias over the base cells and each end of said segments:

designing a logic function consisting of connection path of said segments of said first conductive layer for coupling said base cells of different rows and a connection scheme for coupling said plurality; and coupling said path segments and said plurality using said vias and a second conductive layer, such that said base cells of different rows are coupled at said second conductive layer utilizing a portion of said first conductive layer.

11. A process for fabricating a base cell for a designated function in a gate array comprising the steps of:

providing a gate array having rows of base cells, wherein each base cell is fabricated to include a plurality of transistors and a plurality of segments of a first conductive material coupled to said plurality of transistors, said cell having an insulative layer disposed on said segments, said insulative layer having vias over each end of said segments, such taht each cell is fabricated up to the via level;

defining a routing path between the transistors of said base cell, wherein said routing path comprises at least one of said segments and at least two of said transistors, such that said cell is capable of performing the designated function when said segments and said are coupled; and coupling said transistors of the base cells, wherein said portions of said routing path are coupled together with a second conductive material by their respective vias, such that said base cell is fabricated to perform its designated function at said second conductive layer using a portion of said first conductive layer.

* * * * *